United States Patent [19]
Inoue

[11] Patent Number: 6,001,180
[45] Date of Patent: Dec. 14, 1999

[54] SEMICONDUCTOR WAFER HOLDER WITH CVD SILICON CARBIDE FILM COATING

[75] Inventor: Kazuo Inoue, Osaka, Japan

[73] Assignee: Nippon Pillar Packing Co., Ltd., Osaka, Japan

[21] Appl. No.: 08/927,024

[22] Filed: Sep. 10, 1997

[51] Int. Cl.$^6$ .............................. B05C 11/00; C23C 16/00
[52] U.S. Cl. ...................... 118/500; 118/728; 211/41.18; 269/296
[58] Field of Search ..................................... 118/500, 728; 211/41.18; 269/296

[56] References Cited

U.S. PATENT DOCUMENTS

| | | | |
|---|---|---|---|
| 4,587,928 | 5/1986 | Yonezawa et al. | 118/500 |
| 4,987,016 | 1/1991 | Ohto et al | 428/34.1 |

Primary Examiner—Leo B. Tentoni
Attorney, Agent, or Firm—Townsend and Townsend and Crew LLP

[57] ABSTRACT

A semiconductor wafer holder includes a contact part with a held object to be held. The contact part is constructed of a sintered silicon carbide substrate and then coated with a dense CVD silicon carbide film which has at least one crystal plane orientation out of the (111), (110), (220) and (200) planes in Miller indices to provide excellent grindability despite high hardness to withstand abrasive wear, thus facilitating surface grinding of the contact part into an ultra smooth and flat surface without dust and pit holes. This composite material has a large modulus of elasticity, a small specific gravity, and a very low coefficient of thermal expansion, creating high strength and little change in spite of exposure heat and maintaining dimensional stability in circuit printing. The sintered material together with the crystallized CVD silicon carbide film of the β structure offers an electric resistance under $10^{10} \Omega \cdot cm$ to provide high conductivity, thereby preventing static dust and facilitating cleaning up.

9 Claims, 1 Drawing Sheet

SEMICONDUCTOR WAFER HOLDER WITH CVD SILICON CARBIDE FILM COATING

BACKGROUND OF THE INVENTION

1. Field of the Invention

This invention relates to a holder for fixing by suction thick-film substrates such as semiconductor substrates, alumina, and quartz.

2. Description of the Related Art

There are various types of conventional holders designed to abut a smooth surface of a held object and hold said piece, e.g., devices used in the manufacturing process of semiconductor IC circuits to carry and fix wafers to preset positions. In exposure systems playing a principal role in the lithography process, vacuum chuck apparatus are employed to fix thin-film wafers to inside a plane.

It is known that anodized aluminum alloys and alumina ceramics are the materials currently used for a contact part with the held object to be held by the holder of this type. It is also known that it is impossible for the holder the contact part of which is made of an aluminum alloy to maintain the accuracy of the suction surface thereof over a long period of time due to abrasion or the like, while the holder having an alumina ceramics-made contact part is also not free from difficulty in that when in use, the holding part becomes electrically charged attracting dust particles which transfer and contaminate wafers, diminishing suction accuracy of the held objects to be held.

As a result of micro-miniaturization in recent years, insofar as the semiconductor IC circuit is concerned, it is necessary for the wafer exposure surface to have a completely two-dimensionally flat and ultra smooth surface. Accordingly, it is required that the surface accuracy of the suction surface of the holder (vacuum chuck holder) holding the held object to be held (wafer) is in ultra smooth finish.

When the contact surface of the holder is shaped by machining, the aluminum alloy, despite being soft and easily machinable, readily deteriorates. Alumina ceramics tend to absorb dust particles due to the existence of pin holes and electric charging with a further disadvantage of a large coefficient of thermal expansion.

As explained in the aforementioned prior art techniques, the properties required of materials of the holders designed to hold the held object in contact with the smooth surface of holders are as follows:

(1) Excellent abrasion resistance, i.e., a high degree of hardness;

(2) No suction of dust particles due to the existence of pin holes and electric charging;

(3) Small coefficient of thermal expansion;

(4) Low specific gravity and high strength; and (5) Excellent machinability. The foregoing properties are described hereinunder in detail.

The contact surface between the holder and the held object wears out and suffers damage through repetition of the holing operation. Especially when a thin piece such as a thin-film wafer is sucked to a vacuum chuck holder and held there, the surface of the wafer subjected to suction must be first corrected to the optimum position for the exposure system to produce light, that is, as perfect a two-dimensional plane as possible. Consequently, high abrasion resistance and high hardness are the desirable qualities of the contact surface between the holder and the held object to prevent deformation of the piece due to defects caused by abrasion of the contact surface as well as deformation of the piece due to presence of minute particles generated by abrasive wear resulting from contact therebetween. In case of wafers, deposits of minute particles upon the surface result in wire snapping and shorting in circuit printing.

Further, in addition to the aforementioned abrasive wear, dust being attracted to the electrically charged holder, i.e., infiltrating the pin holes on the ceramic surface, causes the same damage as mentioned above.

In case of the vacuum chuck holder of an exposure system, heat is accumulated due to the absorption of light at the time of exposure. As a result, a large coefficient of thermal expansion of the holder brings about a dimensional change of the holder proper, making it impossible to maintain the wafer in the state of being drawn by suction and fixed to the holder at the preset position. Hence, it is desirable for the coefficient of thermal expansion to be as small as possible to suppress dimensional errors in circuit printing.

When a large-sized held object is to be held, a load on the holding part of the holder becomes heavy, wherefore a material of high mechanical strength is needed for the holder, whereas this would result in increasing the thickness of the material so that an increase in strength runs counter to an endeavor to make the holder lightweight.

The most time- and labor-consuming step of the machining process of materials is the grinding step. Particularly, in the case of the vacuum chuck holder for holding wafers, the contact surface with the wafer must be ultra smooth because of correction required to attain flatness through vacuum suction. Therefore, grindability of the material of the holder becomes a critical factor.

Ceramic material have lately been developed as the materials meeting the above-mentioned prerequisite. However, since the existing ceramic materials which are generally very hard call for considerable amounts of machining as well as grinding energy to effect surface grinding to the level of ultra smoothness described above. Intensification of the grinding work tends to damage the polished surface, hence making it difficult to obtain a smooth and flat surface of high accuracy.

DISCLOSURE OF THE INVENTION

In view of the above-mentioned problems, an object of the present invention is to provide a semiconductor wafer holder which comprises a ceramic composite material wherein a silicon carbide film is formed by CVD(chemical vapor deposition) sintered silicon carbide which functions as a contact part with a held object to be held. As the desirable composite material, sintered α-silicon carbide or sintered β-silicon carbide can be cited for the substrate and crystallized silicon carbide of the β structure can be used for the CVD silicon carbide film.

It is desirable for the above-mentioned CVD silicon carbide film to be composed of a vapor deposition film having at least one crystal plane orientation out of the (111), (110), (220), and (200) planes in Miller indices. It is further desirable for the said CVD silicon carbide film to comprise a vapor deposition film having any two or three types of the structural components of crystal plane orientations out of the (111), (110), (220), and (200) planes in Miller indices. It is most desirable that the said CVD silicon carbide film includes a structural component of the (220) plane orientation in Killer indices and that the said component has an X-ray diffraction strength exceeding 50 times with respect to other structural components of crystal plane orientations.

The electric discharge machining method is normally employed to overcome difficulty in machining conventional ceramic materials. Nevertheless, a region subjected to electric discharge machining mostly comprises the formation of recesses and pin holes so that for making the contact surface with the held object smooth, there is no other procedure but to rely on stepwise grinding which is the most difficult step of working ceramic materials. It will be appreciated that for the semiconductor wafer holder of the present invention, a sintered silicon carbide substrate is first formed and the surface thereof is subsequently coated with a CVD silicon carbide film, thus facilitating the manufacture thereof.

Further, inasmuch as the semiconductor wafer holder of the present invention does not use the sintered silicon carbide directly for the contact part with the held object but applies the CVD silicon carbide film to the surface which facilitates grinding, the holder excess in the most critical property, i.e., machinability of the contact surface with the held object into an ultra smooth and flat surface.

Still further, the present invention is characterized by an improvement on the difficulty of surface grinding due to the non-orientation of the crystal planes on the surface of the conventional silicon carbide material by orienting the crystal planes of the silicon carbide vapor deposition film and truing up the planes of cleavage, thus enabling to grind the surface into the ultra smooth and flat surface with less grinding energy while preventing the generation of damage as much as possible.

It will be appreciated that the electric resistance of the sintered silicon carbide composite material used for the present invention is under $10^6 \Omega \cdot cm$. This property is a so-called composite possessing conductivity. In other words, in addition to the properties of high rigidity, light weight, and high hardness of the sintered ceramics, the semiconductor wafer holder according to the present invention has conductivity which is a property hitherto unattainable in the existing $Al_2O_3$ ceramics. Consequently, abrasion resistance thereof has increased and the generation of static electricity at the contact part with the held object is prevented, thereby reducing dust deposit.

The CVD film of this invention is of such dense structure that the film is free from pin holes which are present in normal ceramic surfaces. Hence, the contact part between the semiconductor wafer holder and the held object is clear of any deposit of foreign objects on the pin holes, and should there be any deposit, such deposit can be cleaned and removed with ease.

The CVD silicon carbide film of the present invention can be so produced as to have many kinds of film structures having each orientation plane as mentioned above dependent on the condition of vapor deposition.

It will also be noted that no definite method is designated in forming the CVD silicon carbide film according to this invention insofar as formation of the film having especially the foregoing function is possible. Although the normal method is thus employed, formation by means of the reduced pressure CVD under non-acidic atmosphere is preferable.

So long as the semiconductor wafer holder of the present invention has a mode of holding the held object by abutting the smooth and flat surface thereof, no specific limitations are placed on application thereof, e.g., holders (vacuum chuck holders fixing wafers within a plane in the exposure systems of the lithography process, etc.) used for carrying and holding wafers for semiconductor substrates.

BRIEF DESCRIPTION OF THE DRAWINGS

Other features in structure, operation and advantage of the present invention will become more apparent to those skilled in the art from the following description when read in conjunction with the accompany drawings, in which.

DETAILED DESCRIPTION OF PREFERRED EMBODIMENT

Figure 1:
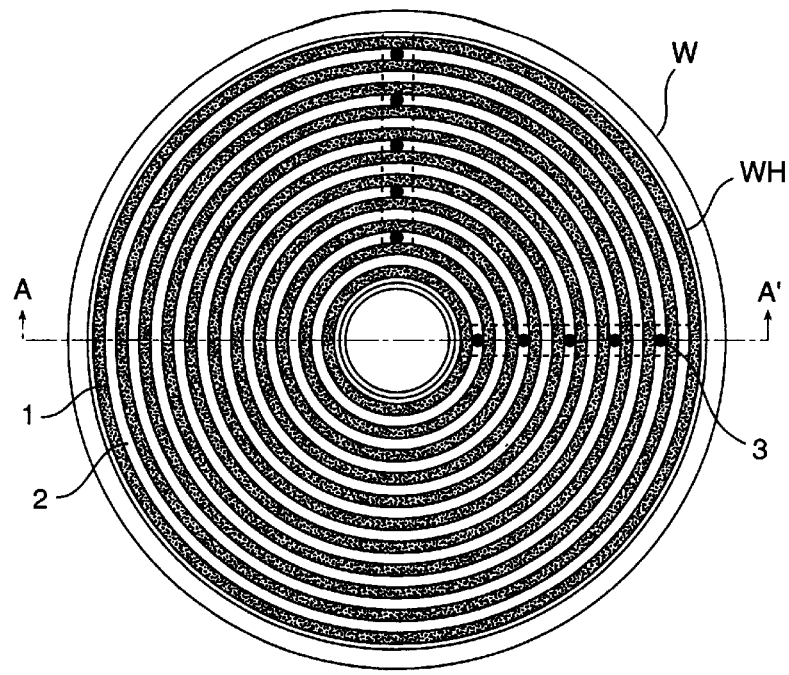
FIG. 1 is a schematic plan view of a vacuum chuck holder according to an embodiment of a semiconductor wafer holder of the present invention.

Referring first to test examples, the effects of the present invention will be described hereinunder in detail.

TEST EXAMPLE 1

There are shown in Table 1 physical properties of vacuum chuck holders (hereinafter may be referred to as "Holders") wherein silicon carbide films were formed with each material used for conventional Holders in reduced pressure chemical deposition under non-acidic atmosphere of an embodiment. Each physical property of a metal, ceramics, stainless steel representing respective materials, and alumina are shown for comparative materials. Table 1

TABLE 1

|  | Modulus of elasticity (kg/mm$^2$) | Specific gravity | Surface pore condition | Electric resistance ($\Omega \cdot cm$) | Hardness (Hv) | Coefficient of thermal expansion ($\times 10^{-6}/^\circ$ C.) |
| --- | --- | --- | --- | --- | --- | --- |
| Stainless steel | 20,000 | 8.1 | Medium | $7 \times 10^{-5}$ | 200 | 17.3 |
| $Al_2O_3$ | 35,000 | 3.8 | Poor | $\geq 10^{14}$ | 1,800 | 7.1 |
| Sintered SiC + chemical deposition SiC film | 40,000 | 3.1 | Good | $10^6$ | 2,500 | 4.1 |

The following information is obtained from Table 1. As the applicable property values for use in evaluation of the holders calling for flatness and the materials for carrier devices requiring small size and high performance, a comparison of the modulus of elasticity to the specific gravity indicates that in both cases, the CVD silicon carbide composite material according to this invention shows the most desirable values of a large modulus of elasticity and a small specific gravity. Of the three materials, this material has the least coefficient of thermal expansion, thus creating little dimensional change even when heat is accumulated through a long period of exposure time. That is, use of such material to construct a vacuum chuck holder is certain to produce little dimensional error in circuit printing of a wafer which is fixed by suction.

There are hardly any pin holes on the surface chemically deposited from the vapor or the contact surface with the held object. Hence, the chances are very small for dust depositing on the suction surface, resulting in little possibility of degradation of flatness of the held object due to the presence of dust between the contact surface and the held object. It will also be appreciated that high hardness thereof makes it impossible to cause minute particles to generate through abrasive wear and deposit on the held object.

The sintered α-silicon carbide to be used as a substrate shows an electric resistance of about $10^{10} \Omega \cdot cm$. However, since the carbide has a composite structure with the crystallized CVD silicon carbide film of the β structure according to this invention, the carbide exhibits an electric resistance under $10^6 \Omega \cdot cm$ which provides for excellent conductivity in ceramics, hence causing no dust deposit on the holder generated by static electricity. Even if there should be some dust deposit, such deposit can be easily removed. The cleaning up of the holder is therefore simplified.

Further, the small coefficient of thermal expansion is responsible for little dimensional change of the holder through heat accumulation at the time of exposure, etc. Consequently, when the wafer is held and a high-sensitivity photoresist is used for a long period of exposure time under low-intensity light, the dimensional error of the wafer can be held within the tolerance.

TEST EXAMPLE 2

A comparison between the vapor deposition film obtained by arranging to orient the crystal planes in the (220) and (111) planes in Miller indices and the vapor deposition film of no orientation was made with respect to the grinding energy required for grinding and time, with a finding that the oriented film was superior to the non-oriented film in that the oriented vapor deposition film had far less energy consumption as well as a clear difference in the polished state of surface.

TEST EXAMPLE 3

The crystal structures of both vapor deposition films formed under reduced pressure or normal pressure atmosphere were subjected to X-ray diffraction for comparison, the result being that the crystal structure of the film formed under the reduced pressure atmosphere had the (220) plane approximately 52 more times more than the (111) plane in Miller indices, in contrast to the record of about 32 times more under the normal pressure atmosphere. Since grinding becomes more difficult in the materials of non-oriented crystal structure than the materials of oriented crystal structure, this means that the film formed under the reduced pressure atmosphere with more orientations in the direction of the (220) plane provides for superior grindability.

EMBODIMENT

An embodiment of a semiconductor wafer holder according to the present invention will be described hereinunder with reference to the accompanying drawings.

Figure 2:
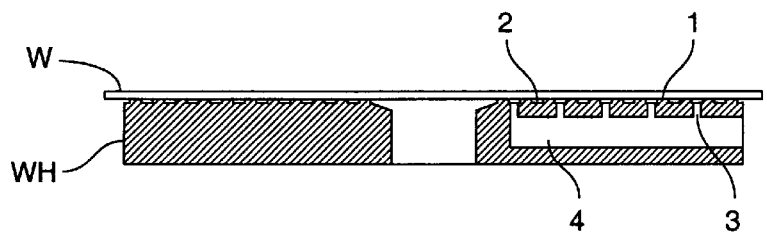
FIG. 2 is a sectional schematic illustration of the vacuum chuck holder of FIG. 1.
Figure 3:
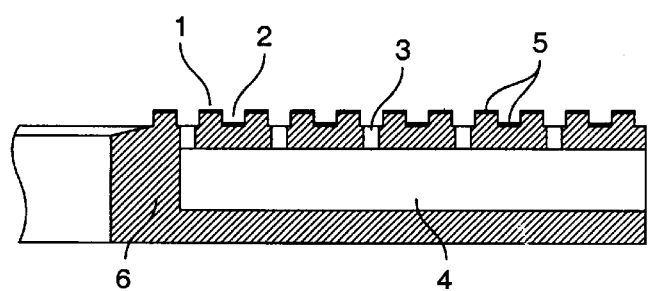
FIG. 3 is a partially enlarged view of the sectional schematic illustration of the vacuum chuck holder of FIG. 2.

FIG. 1 is a plan view showing a schematic illustration of a construction of a vacuum chuck holder for fixing a wafer which is an embodiment of the semiconductor wafer holder according to this invention. FIG. 2 is a sectional view taken on line A—A' of FIG. 1. FIG. 3 is a partially expanded view of FIG. 2.

A wafer suction surface of the vacuum chuck holder WH according to this invention is in a circular shape with a diameter slightly smaller than that of the wafer W. A plurality of annular protrusions 1 (wafer W holding part) and annular recesses 2 (vacuum suction grooves), both concentric about the center of a holder WH, are formed in rings at a fixed spacing on the wafer suction surface.

At each annular recess 2 is radially formed an inlet port 3 for vacuum suction, each inlet port 3 in communication with a sleeve-shaped port 4 (vacuum suction port) radially extending to inside the holder WH. Connection of the port 4 to a vacuum source with subsequent depressurization causes a negative pressure in a space surrounded by the reverse side of the wafer W and each annular recess 2, so that the reverse side of the wafer W, following the top surface of the plurality of annular protrusions 1, is corrected for leveling.

In this embodiment, the holder OH proper was constructed by coating a sintered silicon carbide substrate with a silicon carbide film formed by CVD. First, an α-silicon carbide substrate 6 shaped as shown in FIG. 1 and FIG. 2 was sintered. Since the sintering frame had already been worked to provide annular protrusions 1 and recesses 2 (0.2–0.5mm deep) therein, the formed sintered holder substrate had printed protrusions and recesses. Machining was again performed to make the crest width of the annular protrusions 1 precisely 0.2 mm and grinding was conducted thereon to make a surface coarseness up to 0.01 mm.

The wafer holding surface and the groove surface of the substrate were treated with simultaneous film forming. Namely, both surfaces of the annular protrusions 1 and the annular recesses 2 were subjected to chemical vapor deposition of high-purity silicon carbide under two different conditions of vapor deposition, resulting in respective formations of a silicon carbide film 5. One was depressurized vapor deposition under non-acidic atmosphere with a vapor deposition temperature of 1300° C. at a vapor deposition rate of 10 to several tens μm/h, while the other was normal pressure vapor deposition under non-acidic atmosphere with the same vapor deposition temperature at the same vapor deposition rate.

The two surfaces of the vacuum chuck holder thus obtained were then machine-polished by diamond powder for five hours, whereupon the film surface obtained by vapor deposition under the aforementioned depressurized atmosphere was finished by grinding to 8 Årms and the other film surface obtained by vapor deposition under the normal pressure atmosphere was finished to 500 Årms.

As the foregoing description has shown, inasmuch as manufacture of the semiconductor wafer holder of this invention comprises a formation of a sintered silicon carbide substrate with a subsequent coating of a CVD silicon carbide film thereon, the manufacture thereof is easy. Also, the sintered silicon carbide is not used directly for a contact part with the held object, but a CVD silicon carbide film which facilitates grinding is used for the surface, thereby providing for excellent workability of the contact surface with the held object into a smooth and flat surface the most critical factor.

Furthermore, this invention enables the surface of the CVD silicon carbide film to be ground smooth and flat with consumption of less grinding energy while preventing the generation of damage as much as possible by orienting the crystal planes thereof and truing up the planes of cleavage.

In particular, by coating the CVD silicon carbide film under non-acidic atmosphere in reduced pressure, the generated film forms a specific crystal structure, thereby facilitating formation of the ultra smooth and flat surface by means of grinding, which is the most difficult operation in ceramic materials.

Freedom of the silicon carbide film from any pin hole and the property of conductivity of the semiconductor wafer holder according to this invention prevent dust from depositing due to generation of static electricity, wherefore the holder is made simple to clean up.

Another beneficial effect arises from the use of sintered silicon carbide for substrate: high tenacity brought about by the properties of high rigidity and light weight which are characteristic of ceramics makes it possible to hold the held object and make correction to attain a level surface stably over a long period of time. There is a still further property of high dimensional stability as a result of a small coefficient of thermal expansion, which is advantageous when dimensional changes due to accumulation of heat pose a problem.

While there has been described what is at present considered to be the preferred embodiment of the invention, it will be understood that various modifications may be made therein, and it is intended to cover in the appended claims all such modifications as fall within the true spirit and scope of the invention.

I claim:

1. A semiconductor wafer holder, characterized in that a contact part of said holder comprises a sintered silicon carbide substrate, a CVD silicon carbide film being coated thereon, said sintered silicon carbide substrate comprising one of α-silicon carbide and β-silicon-carbide having conductivity said CVD silicon carbide film being β-silicon carbide.

2. A semiconductor wafer holder, characterized in that a contact part of said holder comprises a sintered carbide substrate, a CVD silicon carbide film being coated thereon, said CVD silicon carbide film comprising a vapor deposition film having at least one crystal plane orientation selected from a group consisting of the (111), (110), (220), (200) planes in Miller indices.

3. The semiconductor wafer holder according to claim 2, wherein said CVD silicon carbide film contains any two or three types of the structural components of crystal plane orientations selected from a group consisting of the (111), (110), (220), and (200) planes in Miller indices.

4. The semiconductor wafer holder according to claim 1, wherein said CVD silicon carbide film comprises a vapor deposition film having at least one crystal plane orientation selected from a group consisting of the (111), (110), (220), and (200) planes in Miller indices.

5. The semiconductor wafer holder according to claim 1, wherein said CVD silicon carbide film is formed by reduced pressure CVD under non-acidic atmosphere.

6. The semiconductor wafer holder according to claim 2, wherein said CVD silicon carbide film is formed by reduced pressure CVD under non-acidic atmosphere.

7. The semiconductor wafer holder according to claim 3, wherein said CVD silicon carbide film is formed by reduced pressure CVD under non-acidic atmosphere.

8. The semiconductor wafer holder according to claim 4, wherein said CVD silicon carbide film contains any two or three types of the structural components of crystal plane orientations selected from a group consisting of the (111), (110) (220), and (200) planes in Miller indices.

9. The semiconductor wafer holder according to claim 8, wherein said CVD silicon carbide film is formed by reduced pressure CVD under non-acidic atmosphere.

* * * * *